(12) United States Patent
Wang et al.

(10) Patent No.: US 12,200,897 B2
(45) Date of Patent: Jan. 14, 2025

(54) ELECTRONIC APPARATUS, COOLING MODULE, AND HEAT SINK

(71) Applicant: LENOVO (SINGAPORE) PTE. LTD., Singapore (SG)

(72) Inventors: Hao-Yu Wang, Yokohama (JP); Hajime Yoshizawa, Yokohama (JP); Shusaku Tomizawa, Yokohama (JP); Qianyi Lu, Yokohama (JP); Atsushi Ohyama, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 311 days.

(21) Appl. No.: 17/935,089

(22) Filed: Sep. 24, 2022

(65) Prior Publication Data
US 2023/0189472 A1    Jun. 15, 2023

(30) Foreign Application Priority Data

Dec. 22, 2021   (JP) ................................ 2021-208645

(51) Int. Cl.
    *H05K 7/20*      (2006.01)
    *G06F 1/16*      (2006.01)
    *G06F 1/20*      (2006.01)

(52) U.S. Cl.
    CPC ....... *H05K 7/20154* (2013.01); *G06F 1/1681* (2013.01); *G06F 1/203* (2013.01); *H05K 7/20172* (2013.01); *H05K 7/20409* (2013.01); *H05K 7/20445* (2013.01)

(58) Field of Classification Search
CPC ........... H05K 7/20154; H05K 7/20172; H05K 7/20409; H05K 7/20445; G06F 1/1681; G06F 1/203; G06F 2200/202; G06F 1/1616
See application file for complete search history.

(56) References Cited

U.S. PATENT DOCUMENTS

| | | | | |
|---|---|---|---|---|
| 1,903,402 | A | * 4/1933 | Locke | ................... D06F 71/023 38/34 |
| 6,599,090 | B2 | * 7/2003 | Ozaki | ..................... G06F 1/203 415/206 |
| 7,903,402 | B2 | * 3/2011 | Tomioka | ................. G06F 1/203 361/679.48 |

(Continued)

FOREIGN PATENT DOCUMENTS

| | | | | |
|---|---|---|---|---|
| CN | 2613625 | * | 4/2004 | ......... H05K 7/20154 |
| CN | 101026135 A | | 8/2007 | |

(Continued)

*Primary Examiner* — Anthony M Haughton
*Assistant Examiner* — Hung Q Dang
(74) *Attorney, Agent, or Firm* — SHIMOKAJI IP

(57) ABSTRACT

An electronic apparatus includes: a chassis; a heating element; a cooling module having a fan, a heat sink, and a heat transport device, the cooling module being configured to cool the heating element. The heat sink includes: a base plate; a plurality of fins standing from the base plate and placed with a gap between the fins to define an air channel through which air from the air outlet flows; and an inclined plate dividing the air channel in two stages in the standing direction of the fins and being gradually inclined from upstream to downstream of the air channel.

4 Claims, 6 Drawing Sheets

(56) References Cited

U.S. PATENT DOCUMENTS

| | | | | |
|---|---|---|---|---|
| 8,929,070 | B2* | 1/2015 | Liu | H05K 7/20145 |
| | | | | 165/104.34 |
| 11,334,124 | B2* | 5/2022 | Chao | G06F 1/1681 |
| 12,019,486 | B2* | 6/2024 | Wang | H05K 7/20145 |
| 2010/0294463 | A1* | 11/2010 | Nie | G06F 1/20 |
| | | | | 165/80.3 |
| 2013/0014921 | A1 | 1/2013 | Chen | |

FOREIGN PATENT DOCUMENTS

| | | | |
|---|---|---|---|
| JP | 09069595 | A | 3/1997 |
| JP | 09116054 | A | 5/1997 |
| JP | 2003318339 | A | 11/2003 |
| JP | 2005079349 | A | 3/2005 |
| JP | 2006147618 | A | 6/2006 |
| JP | 2012003153 | A | 1/2012 |
| JP | 2016054236 | A | 4/2016 |
| JP | 2017126639 | A | 7/2017 |
| JP | 2022016917 | A | 1/2022 |
| KR | 101164506 | B1 | 7/2012 |

* cited by examiner

ELECTRONIC APPARATUS, COOLING MODULE, AND HEAT SINK

BACKGROUND OF THE INVENTION

Field of the Invention

The present invention relates to an electronic apparatus including a cooling module, a cooling module, and a heat sink.

Description of the Related Art

Electronic apparatuses such as laptop PCs are equipped with a cooling module to cool heat generating elements such as a CPU (see, for example, Japanese Patent Publication No. 6934093). This type of cooling module includes a heat transport device such as a heat pipe, and a heat sink and a fan that discharge the heat from a CPU or the like transported through the heat transport device to the outside of the chassis.

SUMMARY OF THE INVENTION

A typical heat sink has multiple plate-like fins placed in parallel, and air from the fan flows through the gaps between these fins to dissipate the heat received from the heat transport device.

In the configuration of Japanese Patent Publication No. 6934093, the chassis has an air outlet on the rear side face to discharge the air that has passed through the fins. This rear side face, however, faces a hinge device that connects the chassis with a lid accommodating a display. In this configuration, a portion of the air outlet of the chassis may be blocked by the hinge device, depending on the position and shape of the hinge device. This may result in a decrease of the flow rate of the air passing through the heat sink, which will degrade the cooling performance of the entire module and system performance.

In view of these problems of the conventional techniques, the present invention aims to provide an electronic apparatus capable of suppressing a decrease in the flow rate of the air passing through the heat sink having an obstacle downstream of the heat sink, a cooling module, and a heat sink.

An electronic apparatus according to the first aspect of the present invention includes: a chassis; a heating element in the chassis; and a cooling module having a fan, a heat sink facing an air outlet of the fan, and a heat transport device that transports heat generated by the heating element to the heat sink, the cooling module being configured to cool the heating element. The heat sink includes: a base plate; a plurality of fins standing from the base plate and placed with a gap between the fins to define an air channel through which air from the air outlet flows; and an inclined plate dividing the air channel in two stages in the standing direction of the fins and being gradually inclined from upstream to downstream of the air channel.

A cooling module according to the second aspect of the present invention includes: a fan; a heat sink that faces an air outlet of the fan; and a heat transport device connected to the heat sink. The heat sink includes: a base plate; a plurality of fins standing from the base plate and placed with a gap between the fins to define an air channel through which air from the air outlet flows; and an inclined plate dividing the air channel in two stages in the standing direction of the fins and being gradually inclined from upstream to downstream of the air channel.

A heat sink according to the third aspect of the present invention includes: a base plate; a plurality of fins standing from the base plate and placed with a gap between the fins to define an air channel through which air can circulate; and an inclined plate dividing the air channel in two stages in the standing direction of the fins and being gradually inclined from upstream to downstream of the air channel.

With this configuration, a heat sink having an obstacle such as a hinge device located downstream smoothly discharges the air that passes through it due to the flow-adjustment action by the inclined plate so as to avoid the obstacle, thus increases the air flow rate.

The above-described aspects of present invention suppress a decrease in the flow rate of the air passing through the heat sink having an obstacle downstream of the heat sink.

DETAILED DESCRIPTION OF THE INVENTION

Figure 1:
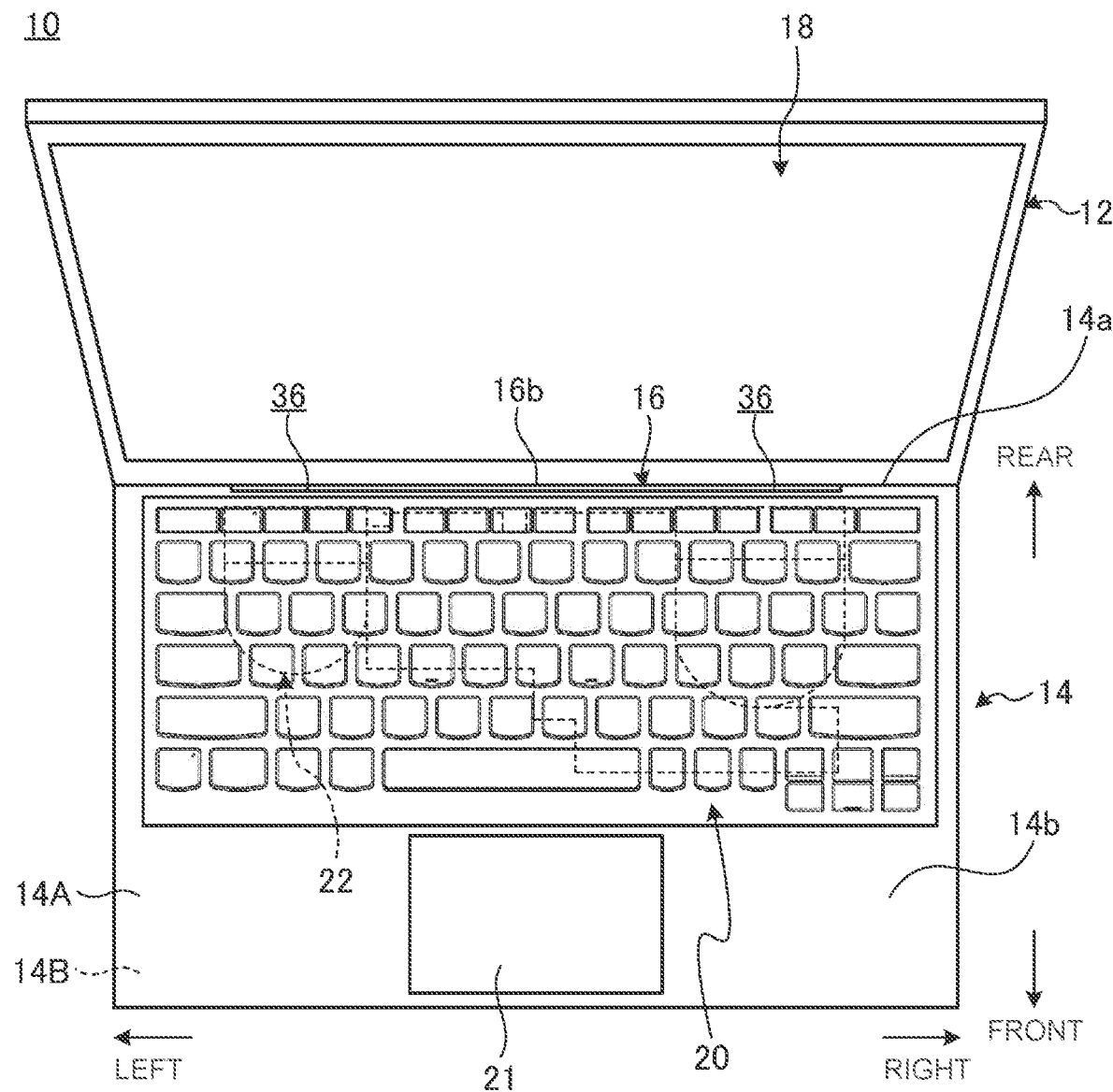
FIG. 1 is a schematic top plan view of an electronic apparatus according to one embodiment.

Referring to the drawings, the following describes an electronic apparatus according to the present invention in details by way of preferable embodiments about the relationship with a cooling module and a heat sink mounted on the electronic apparatus.

FIG. 1 is a schematic top plan view of an electronic apparatus 10 according to one embodiment. As illustrated in FIG. 1, the electronic apparatus 10 is a clamshell-type laptop PC including a lid 12 and a chassis 14 that are relatively rotatably connected with a hinge device 16. The electronic apparatus according to the present invention may be of types other than the laptop PC, including a desktop PC, a tablet PC, and a game machine.

The lid 12 is a thin, flat box. The lid 12 accommodates a display 18. The display panel 18 is an organic EL display or a liquid crystal display, for example.

The following describes the chassis 14 and the elements mounted on this, assuming that, with reference to the posture of the chassis 14 and the lid 12 that are opened as illustrated in FIG. 1 allowing a user to operate a keyboard 20, a part closer to the user is front, a part away from the user is rear, the width is left and right, and the height (thickness of the chassis 14) is top and bottom.

The chassis 14 is a flat box. The hinge device 16 is connected at a rear side face 14a of the chassis 14. The chassis 14 has an upper cover member 14A that defines the top face and the four surrounding side faces and a lower cover member 14B that defines the bottom face. The upper cover member 14A has a substantially bathtub shape with the bottom face open. The lower cover member 14B has a substantially flat plate shape, and serves as a lid that closes the bottom-face opening of the upper cover member 14A.

These cover members 14A and 14B are overlapped in the thickness direction and are detachably connected to each other. The top face 14b of the chassis 14 comes with a keyboard 20 and a touchpad 21.

Figure 2:
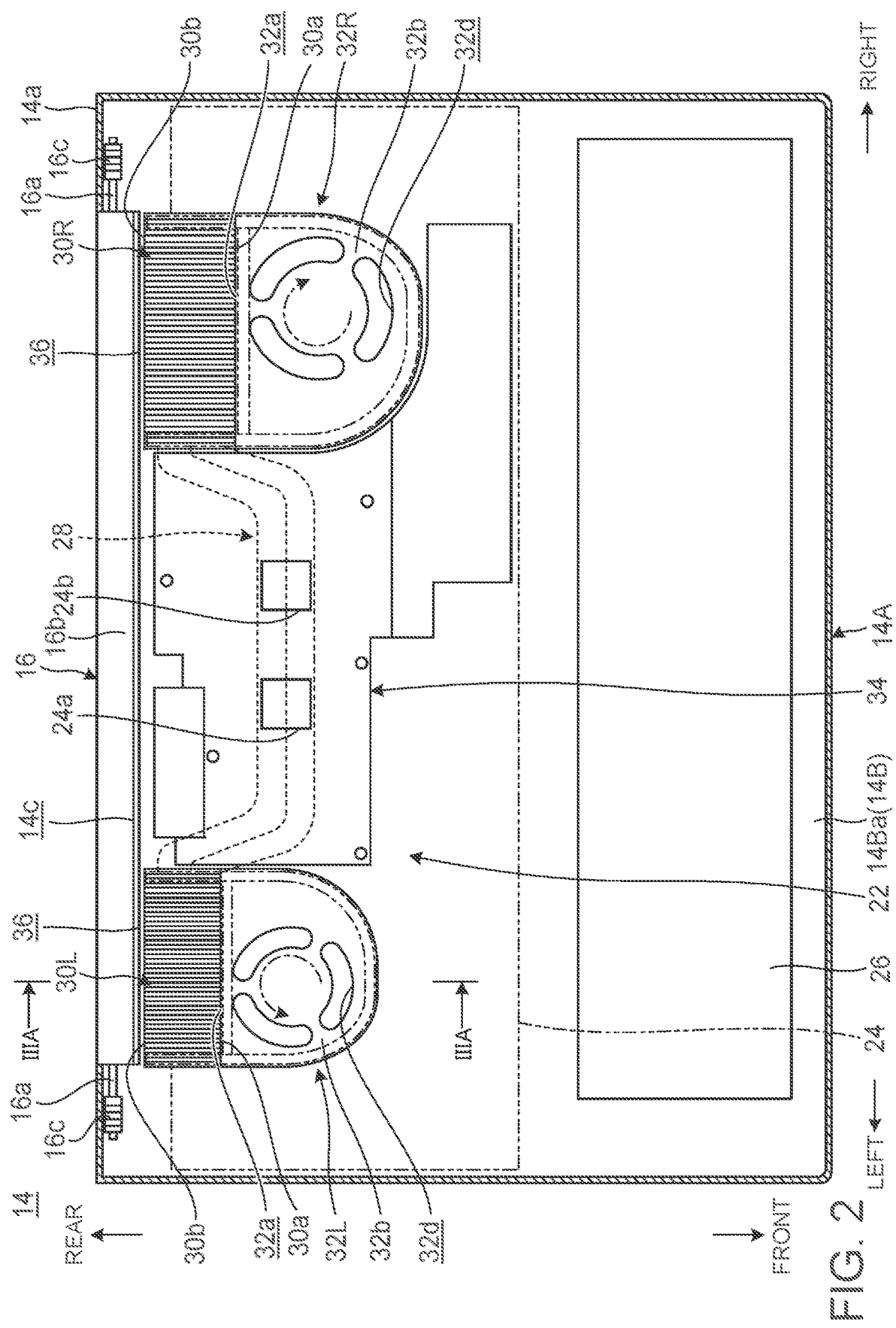
FIG. 2 is a plan view schematically illustrating the internal configuration of the chassis.

FIG. 2 is a plan view schematically illustrating the internal configuration of the chassis 14. FIG. 2 is a schematic cross-sectional plan view of the chassis 14 cut slightly below the keyboard 20.

As illustrated in FIG. 2, the chassis 14 accommodates a cooling module 22, a motherboard 24, and a battery device 26 therein. The chassis 14 also accommodates various electronic components and mechanical components.

The motherboard 24 is a printed circuit board that serves as the main board of the electronic apparatus 10. The motherboard 24 is located close to the rear side of the chassis 14 and extends left to right. On the motherboard 24, various electronic components are mounted, including a central processing unit (CPU) 24a and a graphics processing unit (GPU) 24b as well as a communication module and a storage device. The motherboard 24 is located under the keyboard 20 and is screwed to the back surface of the keyboard 20 and the inner face of the cover member 14Aa of the cover member 14A (see FIG. 3A). The motherboard 24 has the top face that is to be attached to the cover member 14A, and the bottom face, on which the CPU 24a and the like are mounted.

The CPU 24a is located slightly left of the center on the motherboard 24. The CPU 24a is a processor that performs calculations related to the main control and processing of the electronic apparatus 10. The GPU 24b is located slightly right of the center on the motherboard 24. The GPU 24b performs calculations necessary to depict images such as 3D graphics.

The battery device 26 is a rechargeable battery that serves as a power source for the electronic apparatus 10. The battery device 26 is located in front of the motherboard 24 and extends left to right along the front edge of the chassis 14.

Next, the configuration of the cooling module 22 is described.

The CPU 24a and the GPU 24b are heating elements with largest amount of heat generated among the electronic components mounted in the chassis 14. Thus, the cooling module 22 absorbs and diffuses the heat generated from the CPU 24a and the GPU 24b and discharges it to the outside of the chassis 14. The electronic components to be cooled by the cooling module 22 may be other than the CPU 24a and the GPU 24b. The cooling module 22 is stacked below the mounting face of the motherboard 24.

As illustrated in FIG. 2, the cooling module 22 includes two heat pipes 28 as a pair, a pair of left and right heat sinks 30L and 30R, a pair of left and right fans 32L and 32R, and a vapor chamber 34.

The heat pipes 28 are a heat transport device that connects the CPU 24a or the GPU 24b with the heat sink 30, thus enabling highly efficient heat transport. For the heat pipes 28 illustrated in FIG. 2, two heat pipes are used in parallel as a pair, and one or three or more heat pipes may be used. The heat pipes 28 are each a flat metal pipe defining a closed space therein, into which working fluid is enclosed. The working fluid transports heat while flowing through the closed space and undergoing a phase change. The metal pipes are made of metal with high thermal conductivity, such as copper or aluminum. Examples of the working fluid include water, CFC (chlorofluorocarbon) substitutes, acetone, and butane. In one example, the closed space is provided with a mesh made by knitting fine metal wires into a cotton shape and a wick formed with a porous layer.

The heat pipes 28 are pressed against the CPU 24a and the GPU 24b at their central portions, which serve as a heat receiving portion. The heat pipes 28 are joined to bottom faces 30d of the heat sinks 30L and 30R at their left and right end portions, which serve as a heat dissipating portion (see FIG. 3A).

As illustrated in FIG. 2, the fan 32L on the left is located just in front of the heat sink 30L on the left. In other words, the heat sink 30L is placed facing a rearward-opening air outlet 32a of the fan 32L. The fan 32L is a centrifugal fan that rotates an impeller 32c (see FIG. 3A) housed inside a fan housing 32b by a motor. The fan housing 32b has an air inlet 32d opened to one or both of the top face and the bottom face. The fan 32L draws air through the air inlet(s) 32d and discharges the air through the air outlet 32a. Air blown from the air outlet 32a passes through the heat sink 30L to promote the heat dissipation.

The fan 32R on the right is slightly different in size and the like, but has the basic configuration that is symmetrical with the fan 32L on the left. Therefore, like numerals for the fan 32R in the drawings indicate like components of the fan 32L as described above, and a detailed explanation is omitted.

The vapor chamber 34 includes two thin metal plates defining a closed space therebetween, in which working fluid is enclosed. The metal plates are made of metal with high thermal conductivity, such as copper or aluminum. The vapor chamber 34 differs from the heat pipes 28 in that two metal plates are used instead of the metal pipes, but the other structure, including the type of working fluid and the configuration of the wick, may be the same or similar to those of the heat pipes 28.

The cooling module 22 of the present embodiment is configured so that the vapor chamber 34 is stacked on the surfaces of the CPU 24a and the GPU 24b and the heat pipes 28 are stacked on the surface of the vapor chamber 34. The heat pipes 28 are stacked on the bottom faces 30d of the heat sinks 30L and 30R (see FIG. 3A).

Next, the following describes the configuration of the heat sinks 30L and 30R and their peripheral portions.

Figure 3A:
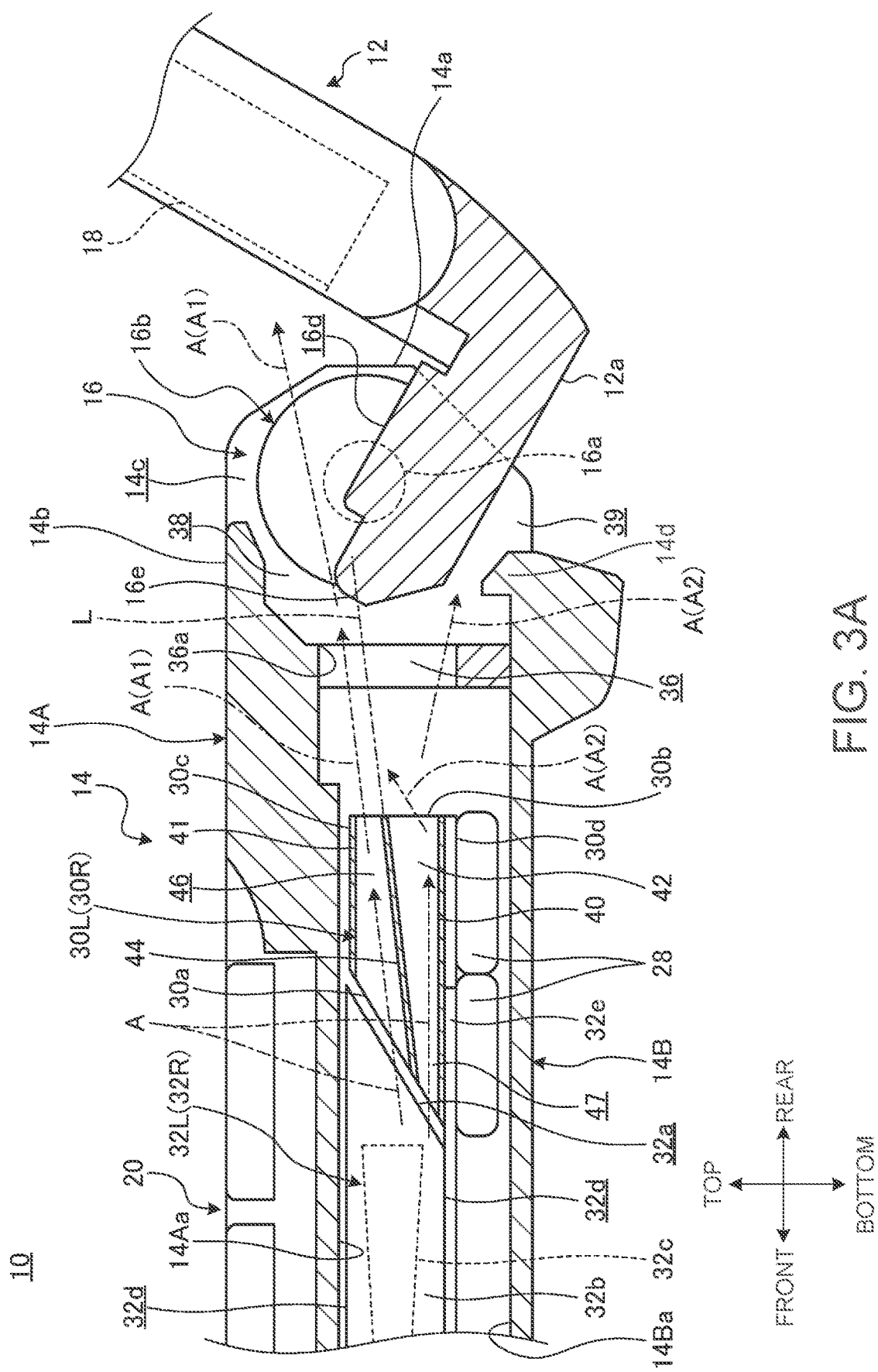
FIG. 3A is a schematic cross-sectional view taken along the line IIIA-IIIA in FIG. 2.
Figure 3B:
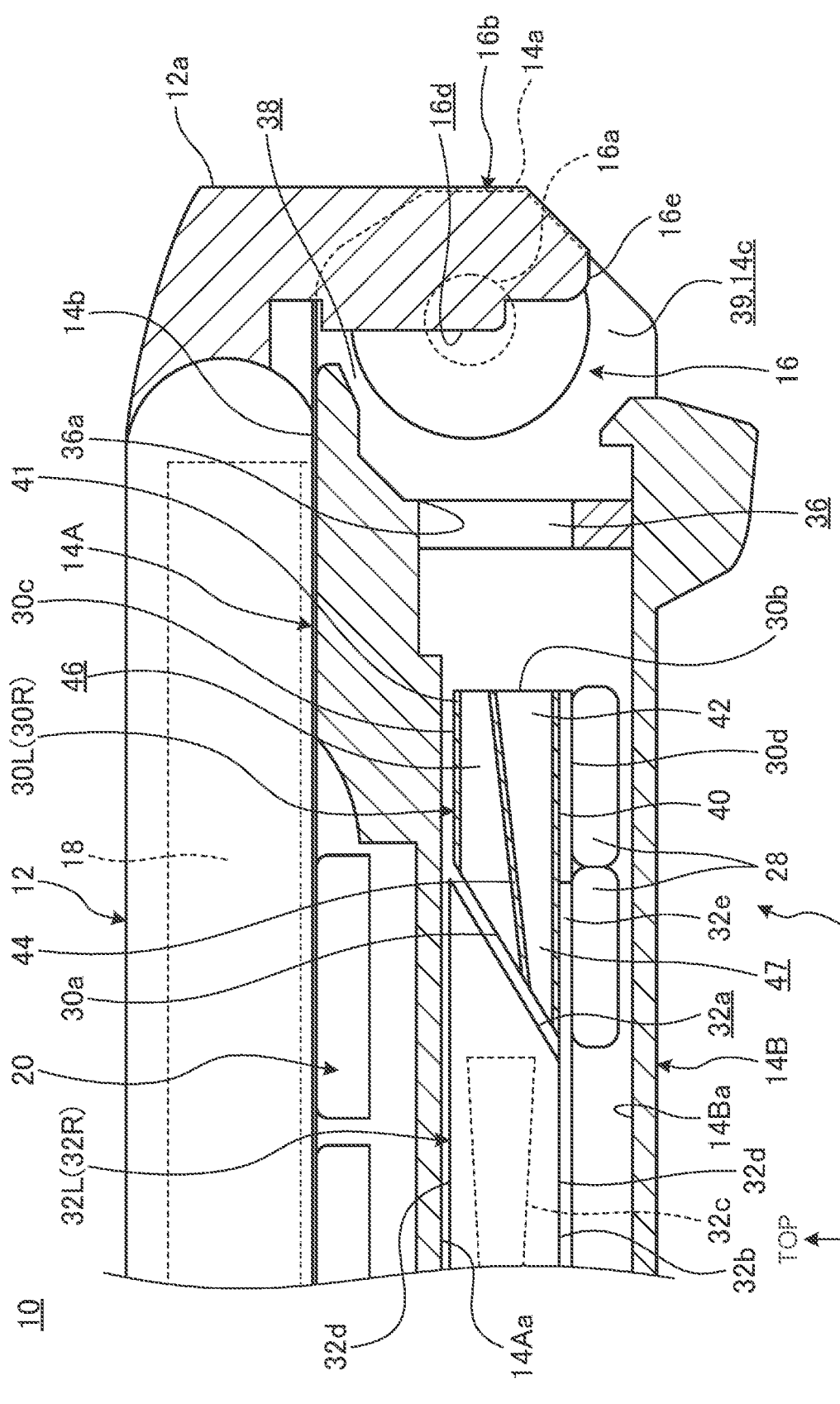
FIG. 3B is a cross-sectional view when the lid is closed on the chassis from the state illustrated in FIG. 3A.

FIG. 3A is a schematic cross-sectional view taken along the line IIIA-IIIA in FIG. 2. FIG. 3A is a side cross-sectional view enlarging the heat sink 30L and its periphery when the lid 12 is opened relative to the chassis 14 so that their faces intersect at 120 degrees. FIG. 3B is a cross-sectional view when the lid 12 is closed on the chassis 14 from the state illustrated in FIG. 3A.

In this embodiment, the right heat sink 30R is slightly different in size and the like, but has the basic configuration that is symmetrical with the left heat sink 30L. The following therefore mainly describes the left heat sink 30L as a representative example. Like numerals for the right heat sink 30R in the drawings indicate like components of the left heat sink 30L, and a detailed explanation is omitted.

First, the configuration of the chassis 14 and the hinge device 16 around the heat sink 30L will be described.

As illustrated in FIGS. 2 and 3A, the rear side face 14a of the chassis 14 has a recessed portion 14c that is an installation space for the hinge device 16. The recessed portion 14c extends in the longitudinal direction of the rear side face 14a extending left and right. This recessed portion 14c has a chassis air outlet 36 that is open in the front inner wall. The chassis air outlet 36 is a through hole penetrating through the chassis 14. In one example, the chassis air outlet 36 has a mesh structure in which a plurality of slits or a large number of holes are arranged.

The hinge device 16 of this embodiment has a shaft 16a, a hinge housing 16b, and a torque generator 16c.

The shaft 16a is a round metal bar that serves as the rotary shaft for the lid 12 and the chassis 14. In FIG. 3A, the hinge housing 16b vertically protrudes forward from the surface of the lower edge 12a of the lid 12. In this way, the hinge housing 16b protrudes jaw-like from the lower edge 12a of the lid 12. The hinge housing 16b is accommodated in the recessed portion 14c and extends over substantially the entire left-right width of the recessed portion 14c. Thus, the hinge device 16 is configured to have a one-bar shape so that the hinge housing 16b extends in the left-right direction. A pair of hinge housings 16b may be placed on the left and right.

The shaft 16a is placed at each of the left and right ends of the hinge housing 16b. One end of the shaft 16a is housed in the hinge housing 16b to be secured to the lid 12. The other end of the shaft 16a passes through the left or right inner wall of the recessed portion 14c and is supported rotatably relative to the chassis 14 via the torque generator 16c.

As illustrated in FIG. 3A, the hinge housing 16b has a channel forming portion 16d in the central portion except for the left and right ends that support the shaft 16a. The channel forming portion 16d has a shape as if the top face (in FIG. 3A) of the hinge housing 16b, which has a substantially bullet-shaped cross section, were cut. The channel forming portion 16d serves as a path for the air coming out of the chassis air outlet 36. The channel forming portion 16d also provides a path for the wiring from the lid 12 into the chassis 14

As illustrated in FIG. 3A, when the lid 12 is opened from the chassis 14, the channel forming portion 16d defines an upper opening 38 between the end face 16e of the hinge housing 16b and the upper edge 36a of the chassis air outlet 36. The channel forming portion 16d in this state also defines a lower opening 39 between a lower corner 14d of the recessed portion 14c on the downstream of the chassis air outlet 36 and the hinge housing 16b. These openings 38 and 39 are portions through which the air that has passed through the chassis air outlet 36 is allowed to pass.

When the lid 12 is closed on the chassis 14 as illustrated in FIG. 3B, the lower opening 39 remains, but the upper opening 38 is closed by the lid 12. It is clear from FIGS. 3A and 3B that if the lid 12 is opened from the chassis 14 even slightly, the upper opening 38 will be open, allowing air to pass through.

Figure 4:
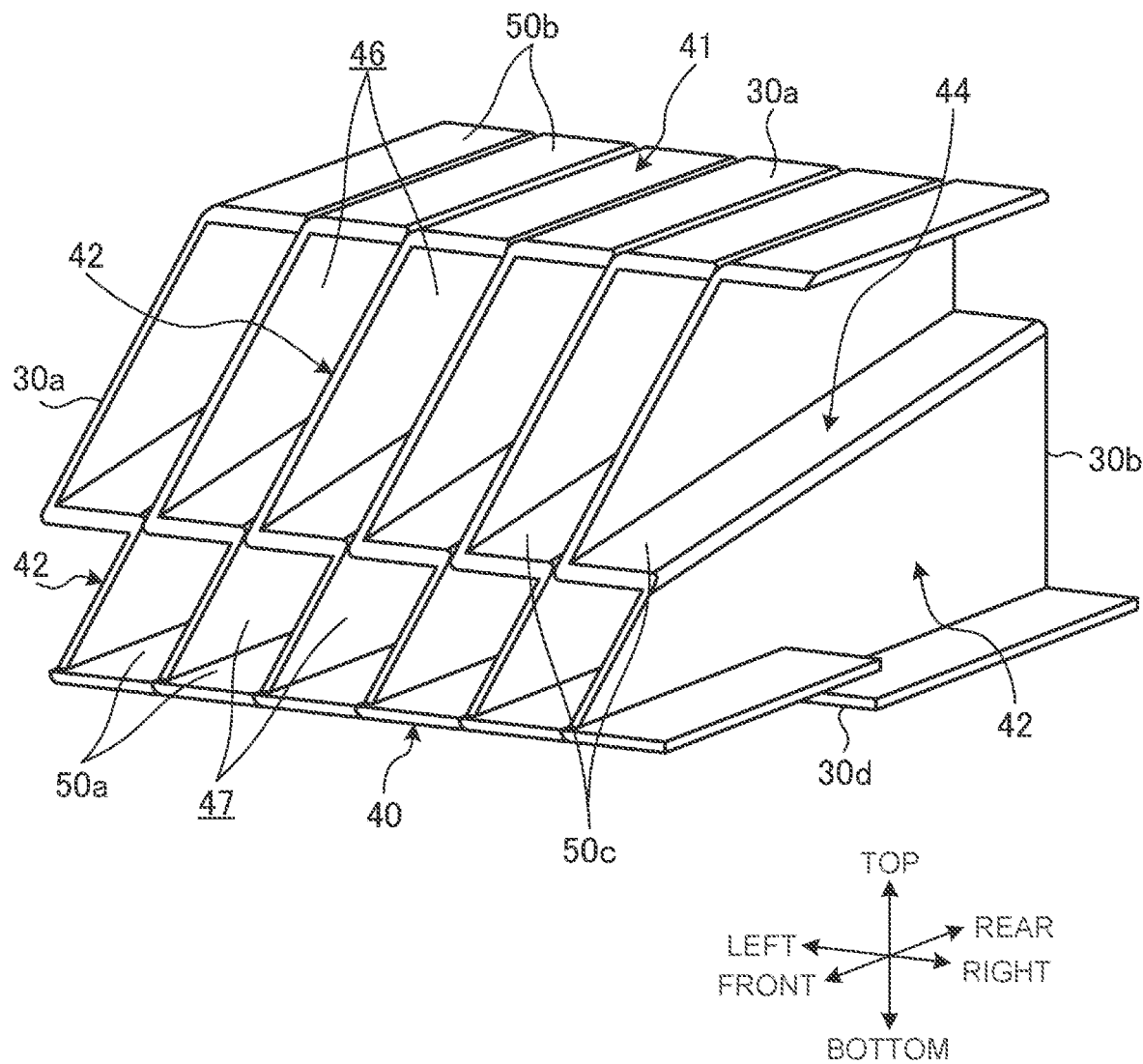
FIG. 4 is a perspective view of the heat sink.

FIG. 4 is a perspective view of the heat sink 30L (30R).

As illustrated in FIGS. 2 to 4, the heat sink 30L includes a base plate 40, a top plate 41, a plurality of fins 42, an inclined plate 44, and upper and lower two stages of air channels 46 and 47.

The base plate 40 is a plate-like section that defines the bottom face of the heat sink 30L. The top plate 41 is a plate-like section that defines the top face of the heat sink 30L. These plates 40 and 41 are parallel to each other with a gap corresponding to the standing height of the fins 42 provided therebetween. The plates 40 and 41 are placed parallel to the bottom face and top face of the fan housing 32b, respectively.

The base plate 40 is placed on substantially the same plane as the bottom face of the fan housing 32b, and closes the lower openings of the air channels 47. The top plate 41 is placed on substantially the same plane as the top face of the fan housing 32b, and closes the upper openings of the air channels 46. The heat pipes 28 are bonded to the surface of either of the plates 40 and 41 by soldering, for example. To which of the plates 40, 41 the heat pipes 28 are to be connected may be determined based on the mounting direction of the motherboard 24 with respect to the chassis 14, for example. In this embodiment, the heat pipes 28 are bonded to the surface of the base plate 40. The top plate 41 may be omitted.

The fins 42 stand up between the plates 40 and 41, and are placed side by side in the left-right direction with a gap between them. With this configuration, each fin 42 defines air channels 46 and 47 in the gap between the adjacent fins. The air channels 46 and 47, through which air from the air outlet 32a flows, penetrate the heat sink 30L from the front side face 30a to the rear side face 30b.

The inclined plate 44 is a plate-shaped section that divides the air channels defined in the gap between the fins 42 and 42 into upper and lower two stages of the air channels 46 and 47. The inclined plate 44 is inclined from the upstream to the downstream of the air channels 46 and 47 in a direction gradually away from the base plate 40. In other words, between the base plate 40 and the top plate 41, the inclined plate 44 is inclined rearwardly upward relative to the faces (extending front-rear and left-right) of these plates 40 and 41. Also in a configuration of the heat pipes 28 connected to the top plate 41, the inclination direction of the inclined plate 44 may be the same as above. Note here that, depending on the structure, arrangement, and other factors of the hinge device 16, it may be preferable to let the air that has passed through the heat sink 30L flow mainly toward the lower opening 39. In this case, regardless of whether the heat pipes 28 are connected to any of the plates 40, 41, the inclined plate 44 may be configured to be gradually inclined from the upstream to the downstream of the air channels 46 and 47 in a direction closer to the base plate 40. In the present embodiment, the surface of the inclined plate 44, particularly the surface facing the air channel 46, is a flat surface, which does not exclude the surface having slightly uneven or curved.

Figure 5A:
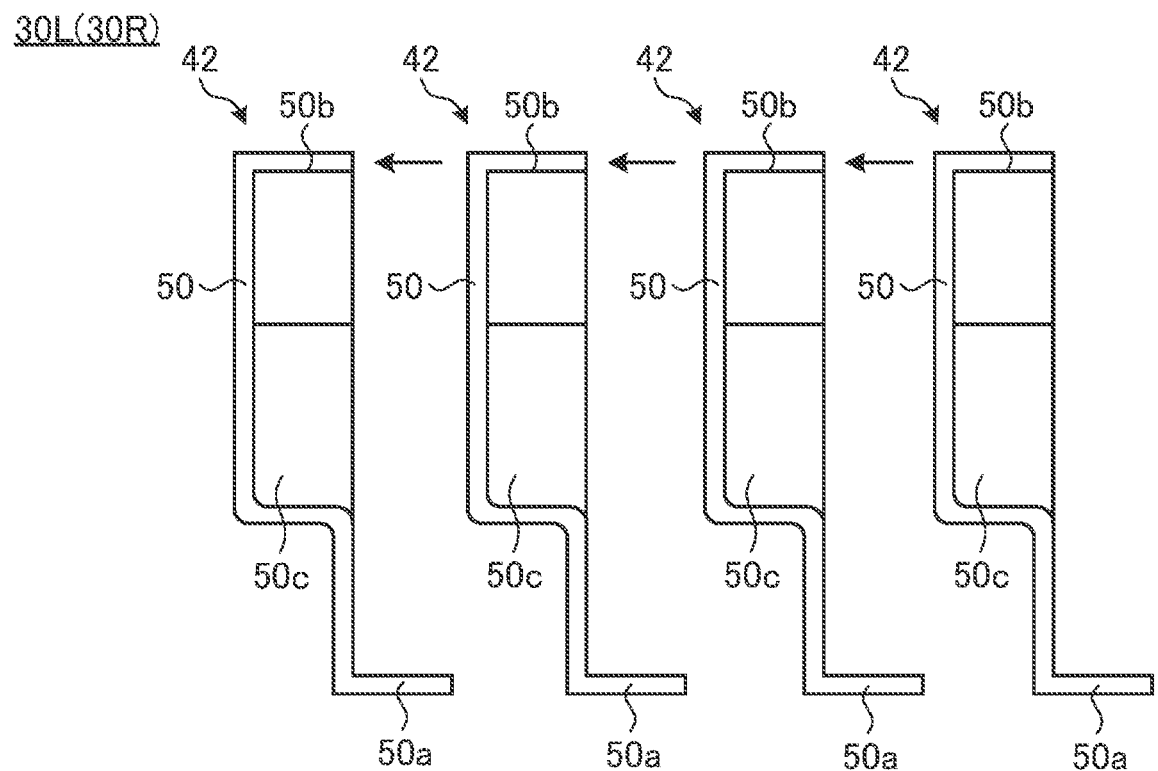
FIG. 5A is a partially exploded front view of the heat sink.
Figure 5B:
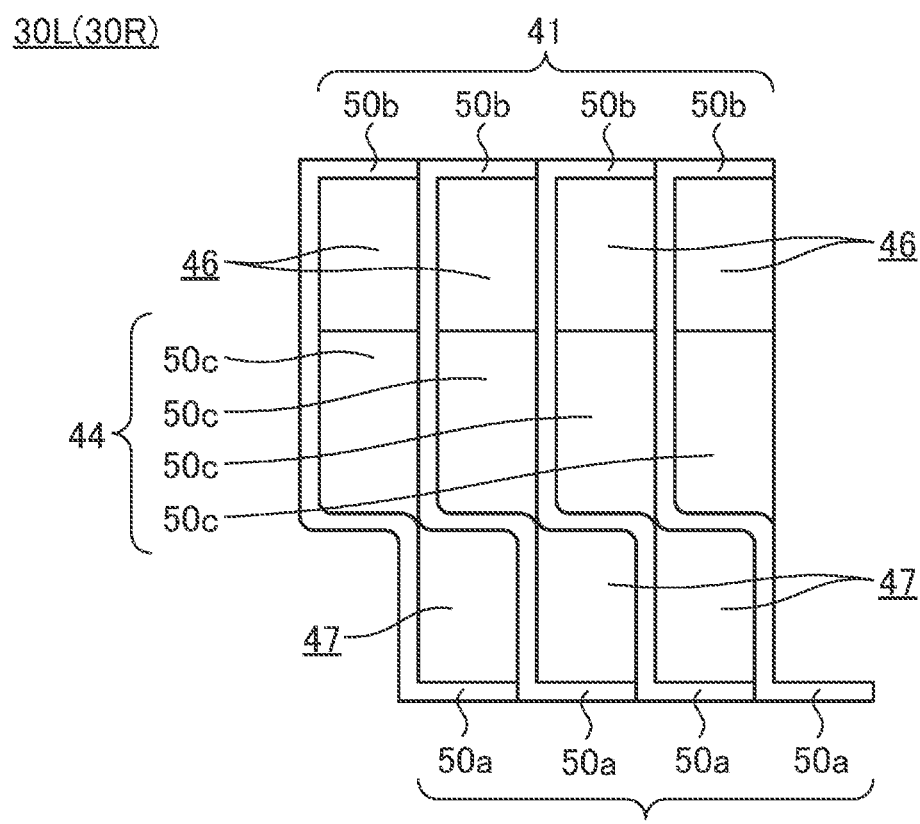
FIG. 5B is a front view of the fins in FIG. 5A that are joined together.

FIG. 5A is a partially exploded front view of the heat sink 30L. FIG. 5B is a front view of the fins 42 in FIG. 5A that are joined together.

As illustrated in FIGS. 4 to 5B, each fin 42 includes a single metal plate 50 that is pressed or bent. In one example, the metal plate 50 is made of metal with high thermal conductivity, such as copper or aluminum.

Each fin 42 has a first protruding piece 50a, a second protruding piece 50b, and an inclined portion 50c.

The first protruding piece 50a is a fin-shaped portion that is bent at right angles at the lower end of the fin 42 in the upright direction or the top-bottom direction of the chassis 14. The second protruding piece 50b is a fin-shaped portion that is bent at right angles at the upper end of the fin 42 in the upright direction. These protruding pieces 50a and 50b protrude toward the adjacent fin 42 in the same direction.

The inclined portion 50c is a crank-shaped portion located near the center of each fin 42 in the standing height, and the inclined portion 50c is inclined rearwardly upward in the depth direction of the fin 42. The inclined portion 50c is bent at right angles twice like a crank between the protruding pieces 50a and 50b. The width of the inclined portion 50c is the same as the protruding length of the protruding pieces 50a and 50b.

The first protruding pieces 50a of the fins 42 are placed side by side continuously to define a plate-like portion, thus forming the base plate 40. The second protruding pieces 50b of the fins 42 are placed side by side continuously to define a plate-like portion, thus forming the top plate 41. The inclined portions 50c of the fins 42 are placed side by side continuously to define a plate-like portion, thus forming the inclined plate 44.

Here, one procedure of the method for manufacturing the heat sink 30L will be described.

This manufacturing method first prepares the required number of the metal plates 50 that make up the fins 42 for the heat sink 30L. The method then forms the first protruding piece 50a and the second protruding piece 50b of each metal plate 50, and forms the inclined portion 50c at a center portion between the first protruding piece 50a and the second protruding piece 50b of the metal plate 50 (see FIG. 5A). These three steps may be performed simultaneously with a press machine or in any order with a bending machine.

Next, the method places the plurality of metal plates 50 each having the protruding pieces 50a, 50b and the inclined portion 50c, that is, the fins 42, in parallel with each other (see FIG. 5A). At this step, the first protruding pieces 50a of the fins 42 are placed like a plate shape to be continuous with each other, and the second protruding pieces 50b are also placed like a plate shape to be continuous with each other. Similarly, the inclined portions 50c of the fins 42 also are placed like a plate shape to be continuous with each other. Then, the adjacent fins 42 are bonded to each other by welding or the like (see FIGS. 4 and 5B). The bonding position is not limited, and in one example, the tip ends of the protruding pieces 50a and 50b are bonded to the surface of the adjacent fin 42, and the bent portion of the inclined portion 50c on one side is bonded to the bent portion of the adjacent fin 42 on the other side. This completes the manufacturing of the heat sink 30L.

Such a manufacturing method can improve the manufacturing efficiency of the heat sinks 30L and 30R, which are small and have complicated shapes and are difficult to manufacture. In other words, the heat sinks 30L and 30R have a structure in which the metal plates 50 each having bent portions in various places are stacked, which leads to an advantage of easy manufacturing.

The structure and manufacturing methods of the heat sinks 30L and 30R are not limited to the above. Another manufacturing method for the heat sinks 30L and 30R may prepare the metal plates 50 each having the inclined portion 50c only and not the protruding pieces 50a and 50b, and bond flat metal plates to the upper and lower ends of each metal plate 50 to form the plates 40 and 41.

Next, the location of the heat sink 30L in the chassis 14 will be described.

As illustrated in FIGS. 3A and 3B, the heat sink 30L is placed so that the front side face 30a faces the air outlet 32a of the fan 32L and the rear side face 30b faces the chassis air outlet 36. In this location, the top face 30c of the heat sink 30L is close to the inner face 14Aa of the upper cover member 14A to extend along the inner face 14Aa. The bottom face 30d of the heat sink 30L is placed along the inner face 14Ba of the lower cover member 14B to have a gap larger than the plate thickness of the heat pipes 28 between the bottom face 30d and the inner face 14Ba.

The heat pipes 28 are bonded to the surface of the base plate 40, that is, the bottom face 30d of the heat sink 30L by soldering, for example. An approximately front half region of the bottom face 30d has a step recessed one step upward. This step receives a cover plate 32e defining the bottom face of the fan housing 32b, and the cover plate 32e is bonded there by soldering, for example.

In the heat sink 30L, the front side face 30a serves as the inlet of the air channels 46 and 47. In this embodiment, the front side face 30a is a slope that is gradually inclined rearwardly upward. The air outlet 32a of the fan 32 is also a slope so as to face the front side face 30a. With this configuration, the air outlet 32A and the front side face 30a face each other with substantially no gap and communicate with each other. These front side face 30a and air outlet 32a may be vertical faces extending in the top-bottom direction.

As illustrated in FIG. 3A, which is a side view of the chassis 14 when the lid 12 is opened from the chassis 14, straight line L extending along the inclined plate 44 of the heat sink 30L and passing through the inclined plate 44 intersects the end face 16e of the hinge housing 16b. This line L is an imaginary straight line indicated with the dashed dotted line in FIG. 3A, which can also be an imaginary plane passing through the inclined plate 44.

Next, the following describes the operation of the cooling module 22 and the effects of the heat sinks 30L and 30R.

The arrows indicated by the dashed dotted lines in FIG. 3A schematically illustrate the flow of air A. The heat from the CPU 24a and GPU 24b is absorbed and diffused in the vapor chamber 34 and transferred to the heat pipes 28. The heat pipes 28 transport the heat received from the vapor chamber 34 efficiently, and transmit the heat to the heat sinks 30L and 30R on the left and right.

The heat sinks 30L, 30R efficiently dissipate the heat received from the heat pipes 28 through the fins 42. At this time, the air A from the fans 32L, 32R passes through the air channels 46 and 47 of the heat sinks 30L and 30R and takes heat from the fins 42. After passing through the heat sinks 30L and 30R, the air A passes through the chassis air outlet 36 and is discharged to the outside of the chassis 14 through the openings 38 and 39.

Specifically, of the air A passing through the heat sinks 30L and 30R, air A1 passing through the upper air channel 46 is gradually adjusted to flow obliquely upward toward the rear along the rearwardly upward slope of the inclined plate 44. As a result, air A1 that has passed through the air channel 46 passes through the chassis air outlet 36 and then smoothly passes through the upper opening 38 in the upper portion of the hinge housing 16b. After passing through the upper opening 38, air A1 flows over the surface of the display 18 and is discharged rearward.

Thus, the heat sinks 30L and 30R have the inclined plate 44 that guides the air passing through the air channel 46 obliquely upward, thereby directing the air toward the upper opening 38. This allows air A1 that passes through the air channel 46 to flow toward the upper opening 38, smoothly avoiding the hinge housing 16b without colliding with it. As a result, the heat sinks 30L, 30R prevent air passing through the air channel 46 from colliding with the obstacle (hinge housing 16b) downstream of the air channel 46, which avoids a decrease in the flow velocity of the air and a reduction of the flow rate that will degrade the heat exchange performance.

Of the air A passing through the heat sinks 30L and 30R, air A2 passing through the lower air channel 47 is lower in the flow velocity than air A1 passing through the air channel 46 because of the hinge housing 16b located downstream. Then, air A2 leaving the air channel 47 is attracted to the upper air A1 having a flow velocity difference, and part of it passes through the upper opening 38 smoothly. The remainder of air A2 leaving the air channel 47 is discharged from the lower opening 39 to the outside of the chassis 14.

In particular, the electronic apparatus 10 of the present embodiment is configured so that, when the lid 12 is opened from the chassis 14 for use as illustrated in FIG. 3A, straight line L indicating the extension of the inclined plate 44 of the heat sinks 30L, 30R intersects the end face 16e of the hinge housing 16b. This prevents air A1 that has passed through the air channel 46 along the inclined plate 44 from colliding with not only the hinge housing 16b but also the upper edge 36a of the chassis air outlet 36 and decelerating. This is because if this straight line L is too steep upwardly to intersect the upper edge 36a, air A1 may collide with the upper edge 36a and its surroundings, resulting in a decrease in flow velocity. The end face 16e has an inclined shape and a curved shape at the portion intersecting the straight line L, which further suppresses a decrease in the flow velocity of the air flowing through the upper opening 38.

FIG. 3A illustrates a state in which the lid 12 is opened from the chassis 14 by about 120 degrees. As described above, if the lid 12 is opened from the chassis 14 even slightly, the blockage of the upper opening 38 by the hinge housing 16b will be released. Therefore, the electronic apparatus 10 enhances the cooling performance due to the inclined plate 44 in a wide range of angles of the lid 12 relative to the chassis 14.

When the lid 12 is completely closed on the chassis 14 as illustrated in FIG. 3B, the velocity and flow rate of air A tends to be lower than in FIG. 3A. However, in this case, the lower opening 39 is wide open, which keeps the necessary and sufficient cooling performance.

Next, the following describes the experimental results of the cooling performance of the heat sinks 30L and 30R of this embodiment (hereinafter referred to as "Example") in comparison with a typical heat sink that does not have the inclined plate 44 (hereinafter referred to as "Comparative Example").

Table 1 shows the results of comparative experiments measuring the cooling performance between when the heat sinks 30L and 30R according to Example were mounted on the electronic apparatus 10 and when the heat sink according to Comparative Example is mounted thereon.

First, in Table 1, "Noise" represents the experimental results of measuring the flow rate of air (cfm) passing through the heat sinks 30L and 30R while fixing the sound levels generated by the fans 32L and 32R at 32, 35, and 38 (dB). In Table 1, "Top flow rate (cfm)" indicates the flow rate of air passing through the upper opening 38 in FIG. 3A and flowing along the surface of the display 18. "Bottom flow rate (cfm)" indicates the flow rate of air passing through the lower opening 39 in FIG. 3A and flowing to below the chassis 14. "Total flow rate (cfm)" is the sum of the top flow rate and bottom flow rate.

Next, in Table 1, "Temperature (35 dB)" indicates the measurement result of the temperature (° C.) of various parts of the chassis 14 when the fans 32L and 32R were fixed at 35 (dB). "APU temperature (° C.)" indicates the surface temperature of the accelerated processing unit (APU), which is an integrated processing unit of the CPU 24a and the GPU 24b. That is, this experiment used the APU instead of the CPU 24a and GPU 24b. "Upper cover temperature (° C.)" and "Lower cover temperature (° C.)" indicate the surface temperatures of the upper cover member 14A and the lower cover member 14B, respectively. "Display temperature (° C.)" indicates the surface temperature of the display 18. In Table 1, "Difference" indicates a value obtained by subtracting the measurement of Comparative Example from the measurement of Example. The ambient temperature was 25° C., for example.

The reason for setting the noise as the experimental conditions is that electronic apparatuses such as laptop PCs typically have an upper limit for the noise generated, and their thermal design is planned with the goal of achieving the desired cooling performance within a range that does not exceed this limit.

As shown in Table 1, the result of this experiment shows that the heat sinks 30L and 30R of Example had a larger flow rate than the heat sink of Comparative Example at all the noises of 32, 35, and 38 (dB). The experimental result also shows that all of the measured temperatures of the heat sinks 30L and 30R in Example were 0.6 to 4.0 (° C.) lower than the measured temperatures of the heat sink in Comparative Example. This experimental result clarified that the heat sinks 30L and 30R of Example exerted larger airflow volume and higher cooling performance than Comparative Example.

TABLE 1

|  |  |  | Comp. Ex. | Difference | Example |
|---|---|---|---|---|---|
| Noise | 32 dB | Total flow rate (cfm) | 1.25 | 0.12 | 1.37 |
|  |  | Top flow rate (cfm) | 0.7 | 0.1 | 0.8 |
|  |  | Bottom flow rate (cfm) | 0.55 | 0.02 | 0.57 |
|  | 35 dB | Total flow rate (cfm) | 1.41 | 0.13 | 1.54 |
|  |  | Top flow rate (cfm) | 0.76 | 0.11 | 0.87 |
|  |  | Bottom flow rate (cfm) | 0.65 | 0.02 | 0.67 |
|  | 38 dB | Total flow rate (cfm) | 1.61 | 0.16 | 1.77 |
|  |  | Top flow rate (cfm) | 0.85 | 0.15 | 1.00 |
|  |  | Bottom flow rate (cfm) | 0.76 | 0.01 | 0.77 |
| Temp. (35 dB) | APU temp. (° C.) |  | 77.0 | −4.0 | 73.0 |
|  | Upper cover temp. (° C.) |  | 42.6 | −0.6 | 42.0 |
|  | Lower cover temp. (° C.) |  | 46.0 | −0.9 | 45.1 |
|  | Display temp. (° C.) |  | 49.0 | −1.0 | 48.0 |

As described above, the heat sinks 30L and 30R of this embodiment each include: the base plate 40; the plurality of fins 42 standing from the base plate 40 and placed with a gap between the fins to define air channels 46, 47 through which air can circulate; and the inclined plate 44 placed to divide the air channels in two stages in the standing direction of the fins 42 and be gradually inclined from upstream to downstream of the air channel 46 in a direction away from the base plate 40.

That is, when the heat sinks 30L and 30R are mounted on the chassis 14, part of the downstream upper opening 38 is blocked by the hinge housing 16b that is an obstacle. To cope with this, the heat sinks 30L, 30R include the inclined plate 44 that defines the direction of the air channel 46 obliquely upward. This allows the electronic apparatus 10 to circulate air that has passed through the heat sinks 30L and 30R while avoiding collision with the hinge housing 16b. As a result, the electronic apparatus 10 increases the airflow volume of the fans 32L and 32R and thus enhances the cooling performance of the cooling module 22, which also enhances the system performance.

In particular, the heat sinks 30L and 30R are expected to enhance the heat exchange performance due to the increase in the surface area at the top and bottom faces of the inclined plate 44, and thus further contribute to the enhancement of the cooling performance of the cooling module 22. Now another configuration of a heat sink is assumed, having an inclined face formed simply by bending the base plate 40 at the downstream portion upward, instead of the inclined plate portion 44. In this configuration, air will collide with the bent portion of the base plate, causing a decrease in flow velocity, and the surface area of the heat sink as a whole also will decrease. This therefore leads to a concern that the heat exchange performance may deteriorate.

The above illustrates the hinge housing 16*b* as an obstruction located downstream of the heat sinks 30L, 30R. This obstacle may be other than hinge housing 16*b*. An example of the obstacle other than the hinge housing 16*b* is the chassis air outlet 36. That is, the electronic apparatus 10 of the present embodiment includes the chassis air outlet 36 having an opening area equal to or greater than the opening area of the rear side face 30*b*, which is the exit of the heat sinks 30L and 30R. The above embodiment therefore illustrates the hinge housing 16*b* as an obstacle. Other electronic apparatuses having different shapes of the chassis 14, for example, however, may fail to keep a large opening area for the chassis air outlet 36. In this case, the chassis air outlet 36 itself may become an obstacle. In that case, the inclined plate 44 of the heat sinks 30L and 30R may be configured to adjust the flow of the air toward the chassis air outlet 36.

The present invention is not limited to the above-described embodiments, and can be modified freely without deviating from the scope of the present invention.

For the heat sinks 30L and 30R as a pair on left and right, only one of them may be used. The same goes for the fans 32L and 32R.

The invention claimed is:

1. An electronic apparatus comprising:
   a chassis;
   a heating element in the chassis; and
   a cooling module having a fan, a heat sink facing an air outlet of the fan, and a heat transport device that transports heat generated by the heating element to the heat sink, the cooling module being configured to cool the heating element,
   the heat sink comprising:
      a base plate;
      a plurality of fins standing from the base plate and having a gap between the fins to define an air channel through which air from the air outlet flows; and
      an inclined plate dividing the air channel in two stages in the standing direction of the fins and being inclined from upstream to downstream of the air channel;
   a lid with a display; and
   a hinge device connecting the chassis and the lid in a relatively rotatable manner,
   wherein
   the chassis has a chassis air outlet on one side face, the chassis air outlet configured for discharging air passing through the air channel of the heat sink to outside,
   the hinge device includes:
      a shaft configured to function as a rotary shaft between the chassis and the lid; and
      a hinge housing protruding from a surface of the lid, accommodating one end of the shaft, and being disposed downstream of the chassis air outlet to cover a portion of the chassis air outlet, and
   wherein, when the lid is open from the chassis, there is an opening between an end face of the hinge housing and an edge of the chassis air outlet to allow air from the chassis air outlet to pass through, and the inclined plate is configured to distribute air toward the opening.

2. The electronic apparatus according to claim 1, wherein the inclined plate is in a plane that intersects the end face of the hinge housing.

3. The electronic apparatus according to claim 1, wherein
   the chassis includes a cover member that defines a top or bottom face of the chassis,
   the heat sink further includes a top plate at a standing end of the fins and parallel to the base plate,
   the top plate is adjacent to an inner face of the cover member and extends along the inner face, and
   the inclined plate has a face that is inclined relative to the base plate and the top plate.

4. A cooling module comprising:
   a fan;
   a heat sink that faces an air outlet of the fan; and
   a heat transport device connected to the heat sink,
   the heat sink comprising:
      a base plate;
      a plurality of fins standing from the base plate and having a gap between the fins to define an air channel through which air from the air outlet flows; and
      an inclined plate dividing the air channel in two stages in the standing direction of the fins and being inclined from upstream to downstream of the air channel;
   a chassis;
   a lid with a display; and
   a hinge device connecting the chassis and the lid in a relatively rotatable manner,
   wherein
   the chassis has a chassis air outlet on one side face, the chassis air outlet configured for discharging air passing through the air channel of the heat sink to outside,
   the hinge device includes:
      a shaft configured to function as a rotary shaft between the chassis and the lid; and
      a hinge housing protruding from a surface of the lid, accommodating one end of the shaft, and being disposed downstream of the chassis air outlet to cover a portion of the chassis air outlet, and
   wherein, when the lid is open from the chassis, there is an opening between an end face of the hinge housing and an edge of the chassis air outlet to allow air from the chassis air outlet to pass through, and the inclined plate is configured to distribute air toward the opening.

* * * * *